United States Patent
Weltin-Wu et al.

(10) Patent No.: US 8,860,514 B2
(45) Date of Patent: Oct. 14, 2014

(54) TIME-INTERLEAVED DIGITAL-TO-TIME CONVERTER

(71) Applicant: Silicon Laboratories Inc., Austin, TX (US)

(72) Inventors: Colin Weltin-Wu, Mountain View, CA (US); Yunteng Huang, Palo Alto, CA (US); Manu Seth, Berkeley, CA (US)

(73) Assignee: Silicon Laboratories Inc., Austin, TX (US)

( * ) Notice: Subject to any disclaimer, the term of this patent is extended or adjusted under 35 U.S.C. 154(b) by 93 days.

(21) Appl. No.: 13/724,960

(22) Filed: Dec. 21, 2012

(65) Prior Publication Data

US 2014/0176201 A1 Jun. 26, 2014

(51) Int. Cl.
| | |
|---|---|
| *H03K 3/02* | (2006.01) |
| *H03B 5/30* | (2006.01) |
| *H03B 19/00* | (2006.01) |
| *H03L 1/02* | (2006.01) |
| *H03K 5/13* | (2014.01) |

(52) U.S. Cl.
CPC ..................................... *H03K 5/131* (2013.01)
USPC .............. 331/74; 331/143; 331/154; 331/176

(58) Field of Classification Search
USPC ............ 327/115, 117, 182; 331/1 A, 74, 111, 331/112, 113 R, 143–145, 153, 154, 176
See application file for complete search history.

(56) References Cited

U.S. PATENT DOCUMENTS

| | | | | |
|---|---|---|---|---|
| 5,699,024 | A * | 12/1997 | Manlove et al. | 331/111 |
| 6,020,792 | A * | 2/2000 | Nolan et al. | 331/111 |
| 6,646,513 | B1 * | 11/2003 | Neidorff | 331/143 |
| 7,034,627 | B1 * | 4/2006 | Kudari | 331/143 |
| 7,109,804 | B2 * | 9/2006 | Mader et al. | 331/16 |
| 7,236,061 | B2 * | 6/2007 | Lin | 331/66 |
| 7,417,510 | B2 * | 8/2008 | Huang | 331/74 |
| 7,474,163 | B1 * | 1/2009 | Wile et al. | 331/143 |
| 7,508,729 | B2 * | 3/2009 | Takeuchi | 365/222 |
| 7,847,648 | B2 * | 12/2010 | Hu et al. | 331/143 |
| 8,026,770 | B2 * | 9/2011 | Shahparnia | 331/143 |
| 8,350,631 | B1 * | 1/2013 | Wadhwa et al. | 331/111 |
| 8,686,771 | B2 * | 4/2014 | Frantzeskakis et al. | 327/159 |

* cited by examiner

*Primary Examiner* — Levi Gannon
(74) *Attorney, Agent, or Firm* — Abel Law Group, LLP

(57) ABSTRACT

A fractional-N divider supplies a divided clock signal. An adjusted divided clock signal is generated in a digital-to-time converter circuit having a delay linearly proportional to digital quantization errors of the fractional-N divider. The adjusted divided clock signal is generated based on first and second capacitors charging to a predetermined level. The charging of the first and second capacitors is interleaved in alternate periods of the divided clock. The charging of each capacitor with a current corresponding to respective digital quantization errors is interleaved with charging with a fixed current. A first edge of a first pulse of the adjusted divided clock signal is generated in response to the first capacitor charging to a predetermined voltage and a first edge of a next pulse of the adjusted divided clock signal is generated in response to the second capacitor charging to the predetermined voltage.

20 Claims, 5 Drawing Sheets

TIME-INTERLEAVED DIGITAL-TO-TIME CONVERTER

BACKGROUND

1. Field of the Invention

This invention relates to generation of clock signals for electronic devices.

2. Description of the Related Art

Electronics devices utilize clock signals to control operation of, e.g., synchronous digital circuits. Clock signals have commonly been generated using crystal oscillators and phase-locked loops. More recently, digital interpolative synthesis has been utilized as described in U.S. Pat. No. 7,417,510. In such an approach, a reference clock is divided by a fractional-N divider, and jitter introduced by the fractional-N divider is reduced by interpolating the output of the fractional-N divider based on the digital quantization error generated by the delta sigma modulator used to control the fractional-N divider. One approach for the interpolation was to interpolate between various phases of the output from the fractional-N divider in order to reduce jitter. In an alternative approach a half clock reference was used to give the interpolator more time to computer interpolated edges since the dynamic range is halved. However, various prior art approaches may have a long absolute delay through the interpolator or require precise duty cycles of the reference clock.

SUMMARY

In an embodiment, an integrated circuit includes a fractional-N divider circuit coupled to receive a first clock signal and supply a divided clock signal. A digital to time converter circuit receives the divided clock signal and a digital value corresponding to a quantization error associated with the fractional-N divider circuit and supplies an adjusted divided clock signal having a delay linearly proportional to the digital quantization error. The digital-to-time converter circuit includes a first capacitor and a second capacitor. The digital-to-time converter circuit further includes a first circuit and a second circuit, which are selectively coupled to supply current to the first and second capacitors. The digital to time converter circuit is configured to generate a first edge of a pulse of the adjusted divided clock signal in response to the first capacitor charging to a predetermined voltage and the digital-to-time converter circuit is configured to generate a next pulse of the adjusted divided clock signal in response to the second capacitor charging to the predetermined level.

In another embodiment a method includes dividing an input clock signal in a divider circuit by integer values. The first capacitor is charged with a first current based on a first quantization error associated with a first integer divide value for the divider circuit. The first capacitor is also charged with a second current having a fixed value. A first pulse of an output clock is generated in response to the first capacitor charging to a predetermined level. A second capacitor is charged with a third current based on a second quantization error associated with a second integer divide value for the divider circuit. The second capacitor is also charged with a fourth current having the fixed value. A second pulse of the output clock signal is generated in response to the second capacitor charging to the predetermined level.

In another embodiment, a method includes supplying a clock signal to a fractional-N divider circuit and supplying a divided clock signal from the fractional-N divider circuit. A first capacitor is charged with a first current corresponding to a first digital quantization error during a first portion of a first period of the divided clock and a second capacitor is charged during a first portion of a next period of the divided clock signal with a second current corresponding to a second digital quantization error. The method further includes charging the first capacitor with a third current having a fixed value during the first period of the divided clock signal and charging the second capacitor with a fourth current having the fixed value during the next period of the divided clock signal. A first edge of a first pulse of the adjusted divided clock signal is generated in response to the first capacitor charging to a predetermined voltage and a first edge of a next pulse of the adjusted divided clock signal is generated in response to the second capacitor charging to the predetermined voltage. An adjusted divided clock signal is supplied including the first and the next pulse respectively having delays linearly proportional to the first and second digital quantization errors.

BRIEF DESCRIPTION OF THE DRAWINGS

The present invention may be better understood by referencing the accompanying drawings in which the use of the same reference symbols in different drawings indicates similar or identical items.

DETAILED DESCRIPTION

Figure 1:
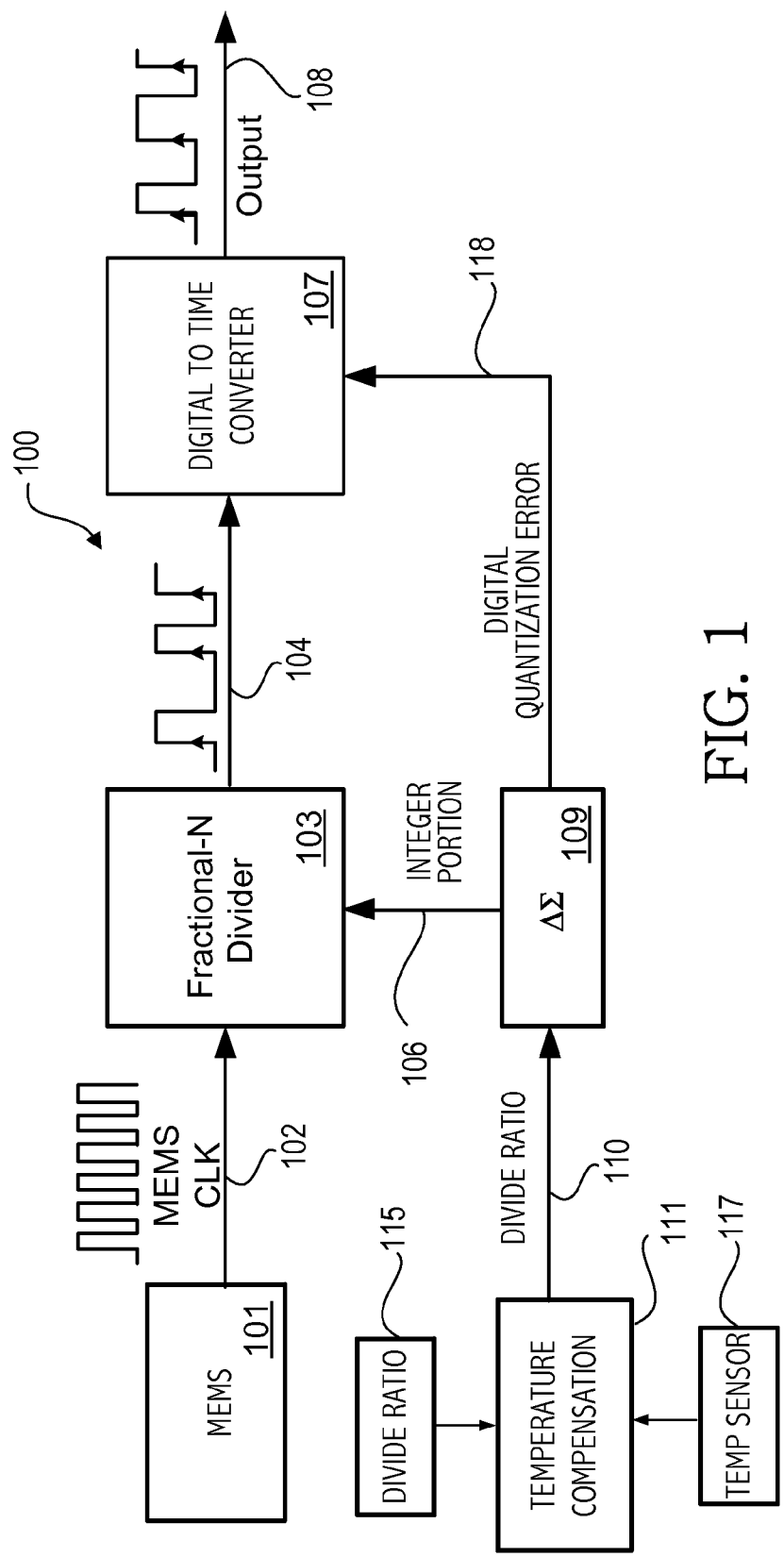
FIG. 1 illustrates a high level block diagram of an embodiment of the invention.

FIG. 1 illustrates an exemplary system 100. The system includes a MEMS oscillator 101 that supplies a reference clock signal 102. A fractional-N divider 103 receives the MEMS clock signal 102 and divides the MEMS clock signal and supplies the divided signal 104 to a digital-to-time converter (DTC) 107 for phase interpolation to adjust the output of the divider 103. A delta sigma modulator 109 controls the fractional-N divider and generates an integer portion 106, which is used as a divide value by the divider 103. The delta sigma modulator 109 receives a divide ratio 110. Because the MEMS oscillator may be sensitive to temperature variations, a temperature sensor 117 and compensation circuit 111 may be used to adjust the divide ratio 110. The digital divide ratio may be stored in memory 115 associated with compensation circuit 111. The integer portion generated by the delta sigma modulator 109 is supplied to the fractional-N divider 103 as divide control signal 106 in a stream of integers to approximate the actual divide ratio, which is typically a non-integer number. The digital quantization error 118, corresponding to the fractional portion of the divide ratio, is supplied to the digitally controlled DTC 107. The jitter introduced by the fractional-N divider 103 is canceled by DTC 107 based on the digital quantization error supplied by the delta sigma modulator 109 as an N bit quantity on 118. In addition, errors associated with the MEMS oscillator may be reduced using the temperature compensation circuit 111. The DTC 107 reduces the quantization errors in the output of the fractional-N divider 103.

Figure 2:
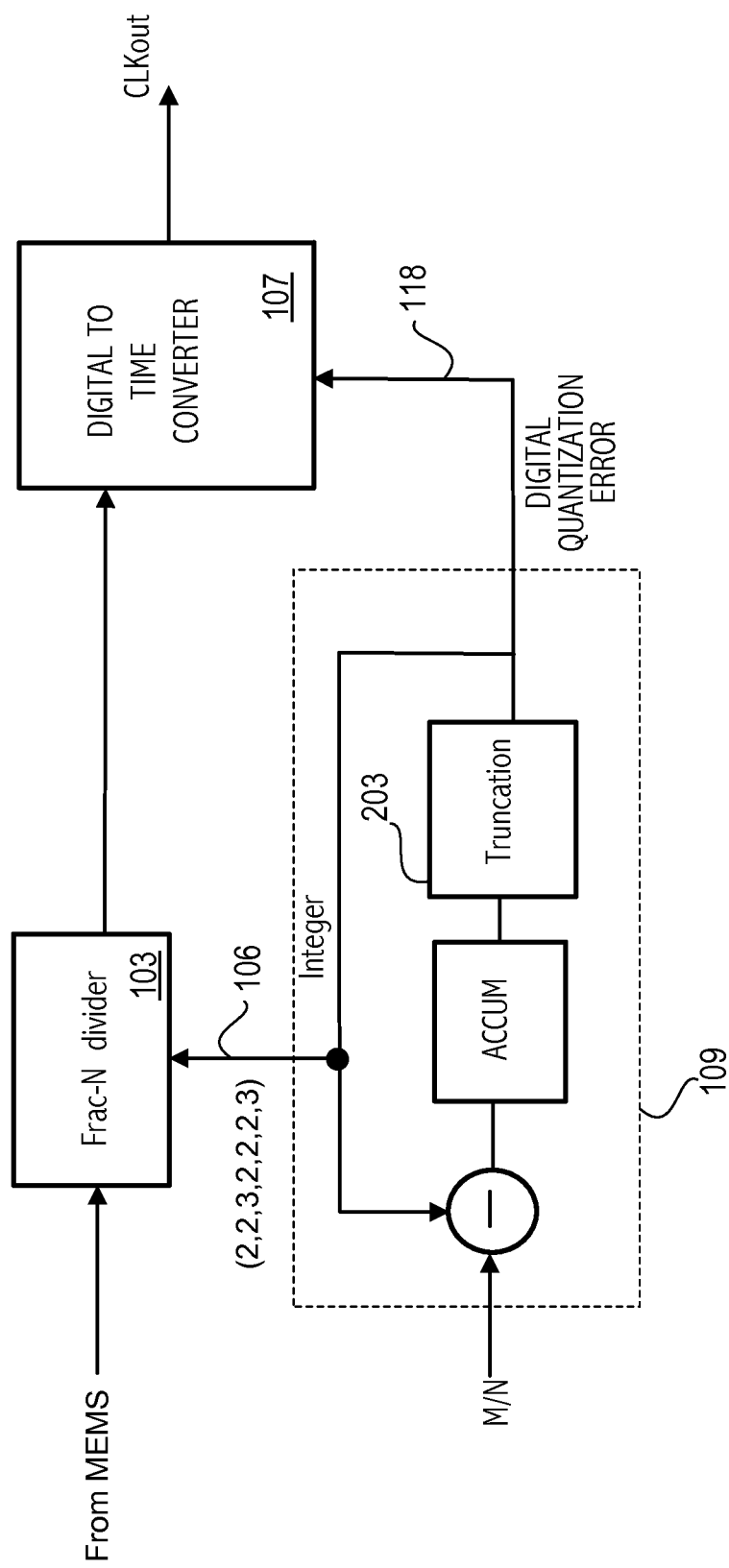
FIG. 2 illustrates a delta sigma modulator that may be used in the embodiment of FIG. 1.

FIG. 2 shows additional details of one embodiment of a first order delta sigma modulator 109 that may be used in the system of FIG. 1. In an embodiment, the integer portion supplied to the fractional-N divider varies between 2 and 3.

Figure 3A:
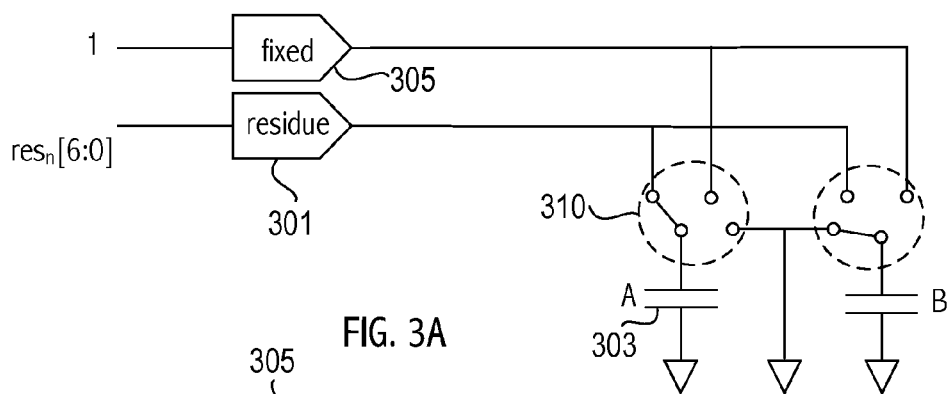
FIGS. 3A to 3D illustrate various aspects of an embodiment of a portion of a digital-to-time converter.
Figure 3B:
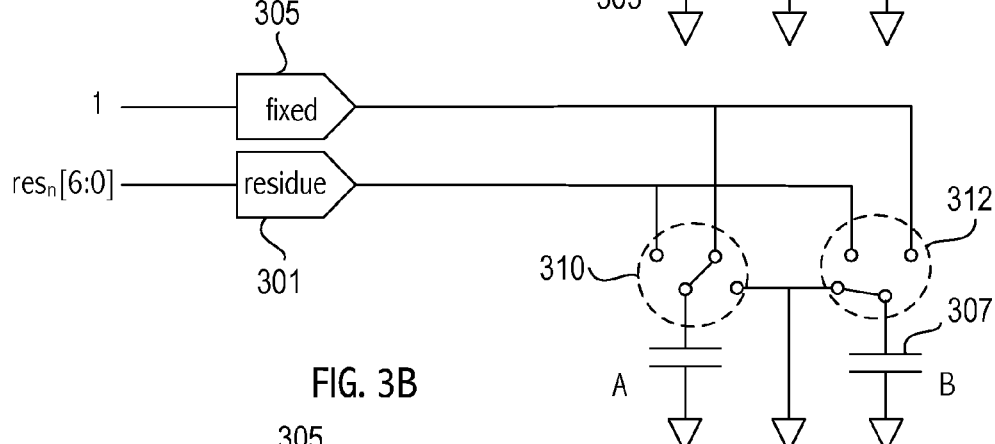

Referring to FIGS. 3A to 3D aspects of the DTC 107 are illustrated. The illustrated embodiments utilize time interleaving. When an edge of the divided clock 104 arrives at the digital-to-time converter 107 the digital-to-time converter generates a delayed edge linearly proportional to the N-bit input code (the digital quantization error) sampled by the arriving edge of the divided clock 104. Referring to FIG. 3A, the digital-to-time converter 107 generates the delayed edge that is linear proportional to the digital quantization error by integrating a current onto a capacitor in two phases. In phase 1 (PH1 A and PH1 B), which lasts for one period of the input clock (see FIG. 4), the digital-to-time converter integrates a variable current supplied from the quantization error digital to analog converter (DAC) 301 equal to $res[N-1:0]/2^N \times Iref$, where res[N−1:0] is the digital quantization error or residue supplied on node 118 (see FIG. 1). The current from the residue current DAC 301 is supplied to capacitor A 303 during the first phase (PH1 A) through switch 310. The fixed current DAC 305 supplies a fixed current to capacitor A 303 through switch 310 during the second phase (PH2 A) as shown in FIG. 3B. The current from the fixed DAC 305 is equal to Iref or the full scale of the current from the residue DAC 301. Thus, residue DAC 301 is a variable current source and DAC 305 is a fixed current source. When the voltage on the capacitor A 303 reaches a reference or trigger voltage, the delayed edge is generated. Embodiments described herein require no duty cycle calibration, and shorten the input-output absolute delay, thereby allowing for lower divide ratios (and thus the reference oscillator can run at a lower frequency relative to the desired frequency, saving power).

Figure 3C:
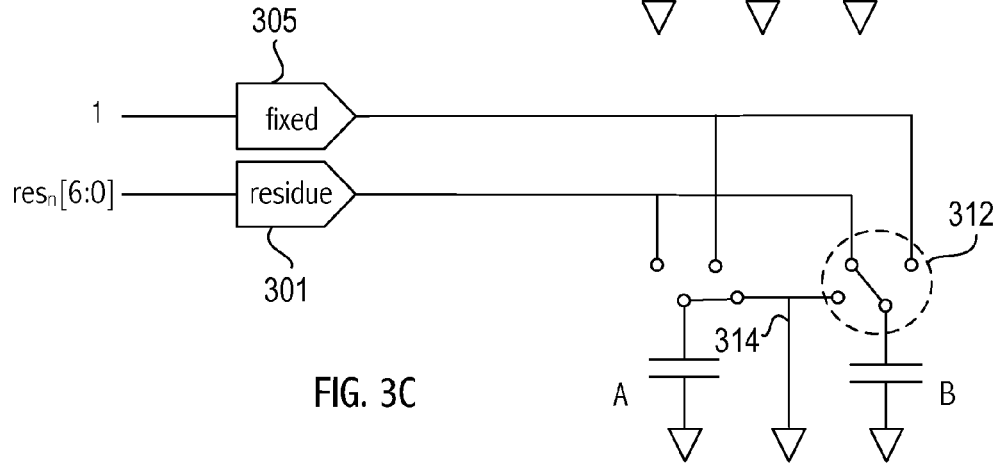
Figure 3D:
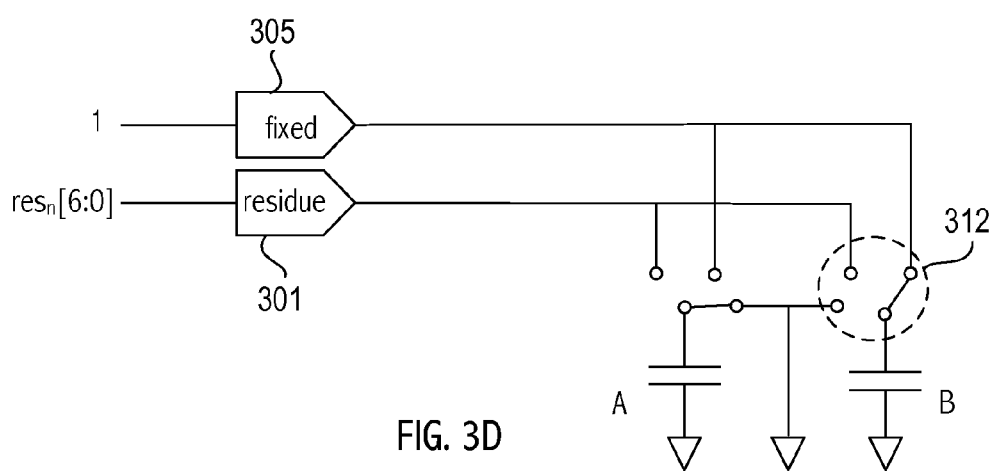

As shown in FIGS. 3C and 3D, in addition to charging capacitor A 303, the digital-to-time converter interleaves charging of capacitor A 303 and capacitor B 307. In phase 1 (PH1 B), capacitor B is coupled to the residue DAC 301 through switch 312 and in phase 2 (PH2 B), the capacitor B 307 is coupled to the fixed DAC 305 through switch 312.

Figure 4:
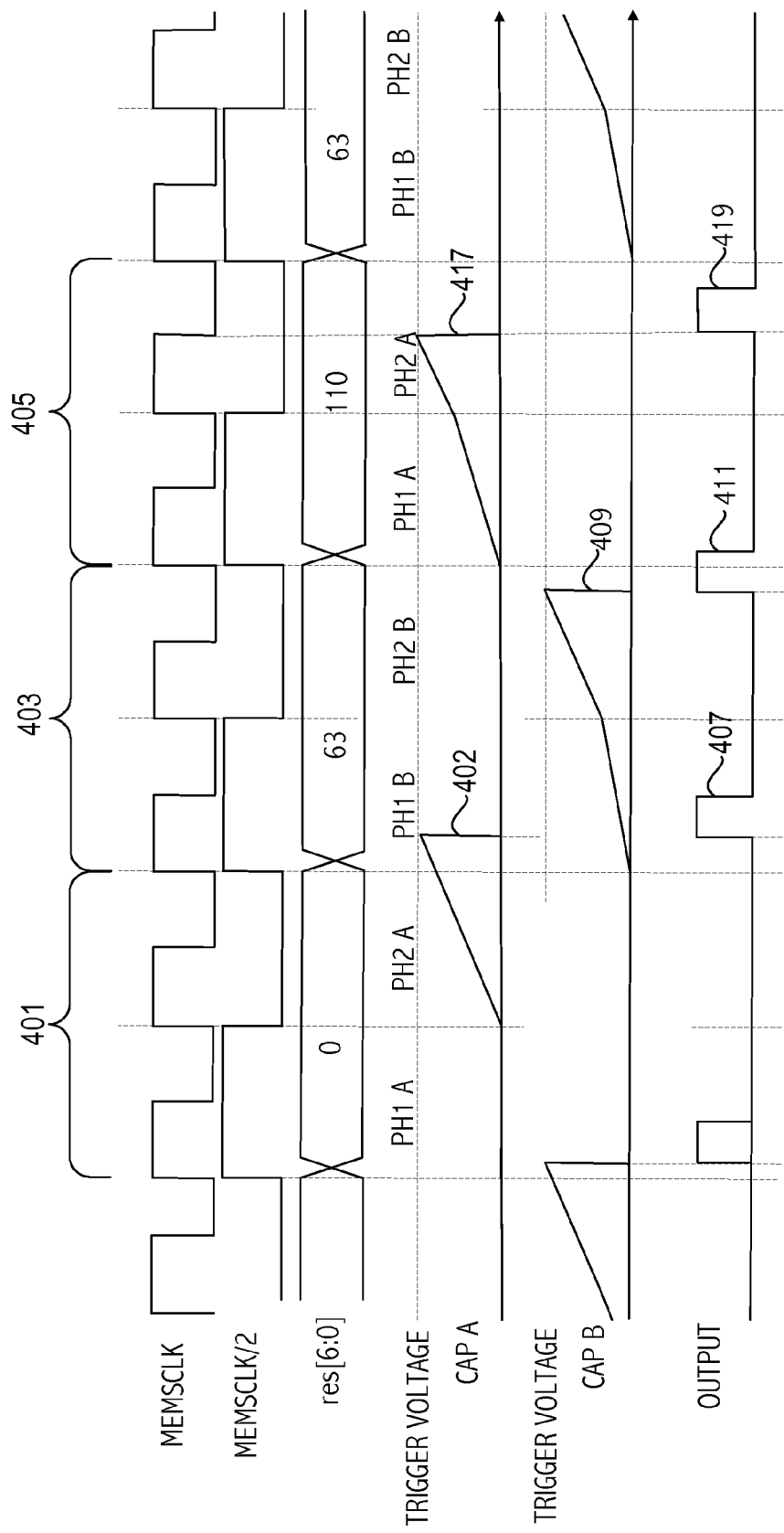
FIG. 4 illustrates an exemplary timing diagram illustrating operation of the digital-to-time converter of FIGS. 3A to 3D.

FIG. 4 illustrates an exemplary timing diagram associated with the operation of the circuits shown in FIGS. 3A to 3D. FIG. 4 shows the MEMS oscillator clock 102 as MEMSCLK, and the output of the divider 103 as MEMSCLK/2. Note that in the embodiment of FIG. 2, the divided value varies between MEMSCLK/2 and MEMSCLK/3. As MEMSCLK/3 is slower, the MEMSCLK/2 is the fastest the digital-to-time converter has to operate and is shown in the illustrated timing diagram. Thus, the period of the divided clock from divider 103 may be longer than shown in FIG. 4.

During the period 401 of the MEMSCLK/2 clock, in phase 1 (PH1 A) the residue DAC 301 charges capacitor A. Because the logical value supplied to the residue DAC is a minimum (shown as 0 in res[6:0]), no charging takes place. In PH2 A of period 401, corresponding to FIG. 3B, the fixed DAC 305 charges capacitor A. In the next period 403 of the divided clock signal MEMSCLK/2, the next phase 1 (PH1 B), the residue DAC 301 charges capacitor B. The digital value supplied to the residue DAC is 63, approximately mid-scale. Here the phase 1 and phase 2 charging cycles are interleaved between two DACs and two capacitors, thus PH1 A and PH2 A are the two charging phases for capacitor A and PH1 B and PH2 B are the two charging phases for capacitor B. Because the fixed DAC charges the capacitor A and the residue DAC charges capacitor B, both capacitor A and capacitor B can be charged during PH1B of the clock period 403 as illustrated. When capacitor A reaches the trigger (or threshold) voltage at 402, the digital-to-time converter 107 generates a pulse 407 in the period 403 of the divided clock signal MEMSCLK/2 with the leading edge of the pulse being the delayed edge of MEMSCLK/2 from MEMSCLK/2 period 401. Responsive to generation of the pulse 407 the switch 312 couples capacitor A to the ground node 314 a shown in FIG. 3C to discharge capacitor A. That readies capacitor A for the next charging cycle. In an embodiment, the divided clock frequency is one half or one third the frequency of the input clock and each phase 1 (PH1 A and PH1 B) lasts for one half or one third of the divided clock. Each phase 2 (PH2 A and PH2 B) lasts for one or two periods of the input clock (one half or two thirds of the divided clock period).

At the falling edge of MEMSCLK/2 in period 403, the switch 312 switches capacitor 307 to the fixed DAC 305, which charges capacitor B until capacitor B reaches the trigger voltage at 409, resulting in pulse 411. The pulse 411 results in capacitor B being discharged to ground by coupling the capacitor B to the ground node 314 as shown in FIG. 3A. That readies capacitor B for the next charging cycle.

In the period 405 PH1 A, the switch 310 connects capacitor A to residue DAC 301. Because the digital value 110 supplied to the residue DAC is close to a maximum of 127, in PH1 A capacitor A charges almost as fast as in PH2 A. At 417, midpoint of the clock period 405, the switch 310 switches charging of capacitor A to the fixed DAC 305. Capacitor A charges to the trigger voltage at 417 resulting in pulse 419.

Figure 5:
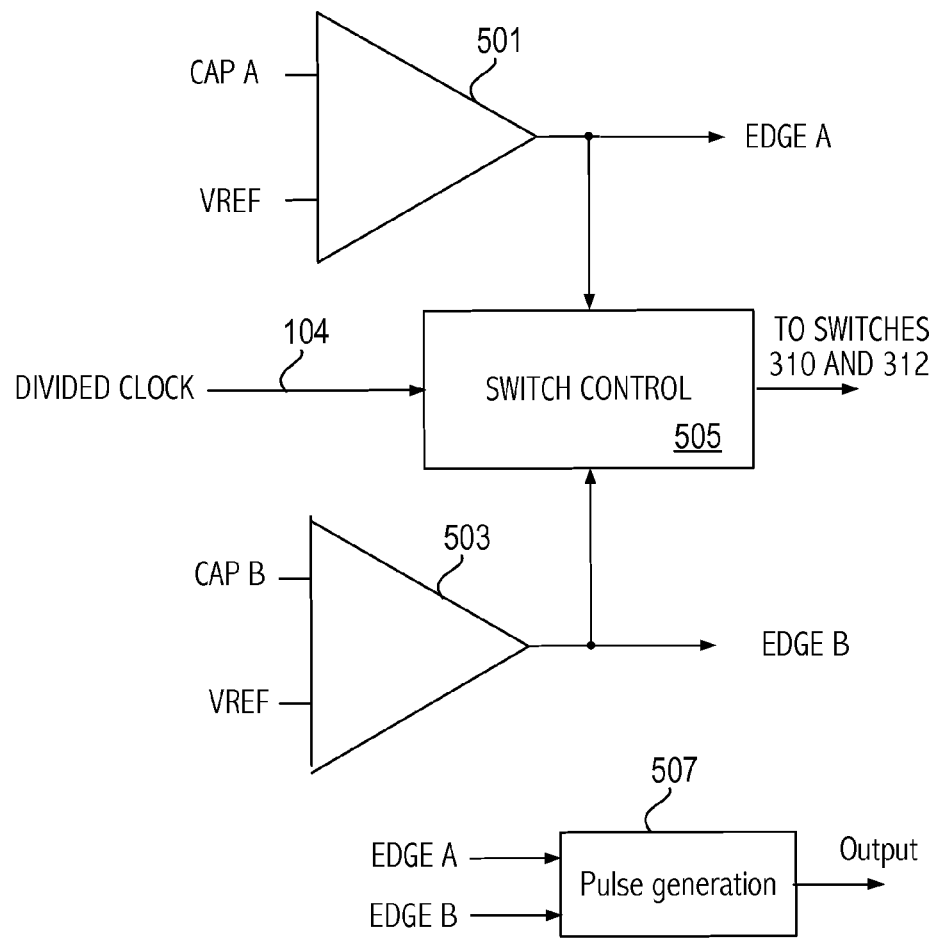
FIG. 5 illustrates additional aspects of an exemplary digital-to-time converter according to an embodiment.

Referring to FIG. 5, an embodiment of the digital-to-time converter 107 includes comparators 501 and 503 to compare the voltage on the capacitors to a reference voltage (the trigger voltage). When the voltages on the respective capacitors reach the trigger voltage, the comparators supply the signals EDGE A and EDGE B used to indicate the leading edge of pulses by the pulse generation logic 507 that supplies the output 108. The divided clock signal 104 (see FIG. 1) and EDGE A and EDGE B are supplied to switch control logic to control the switches 310 and 312 in accordance with the timing diagram of FIG. 4.

Figure 6:
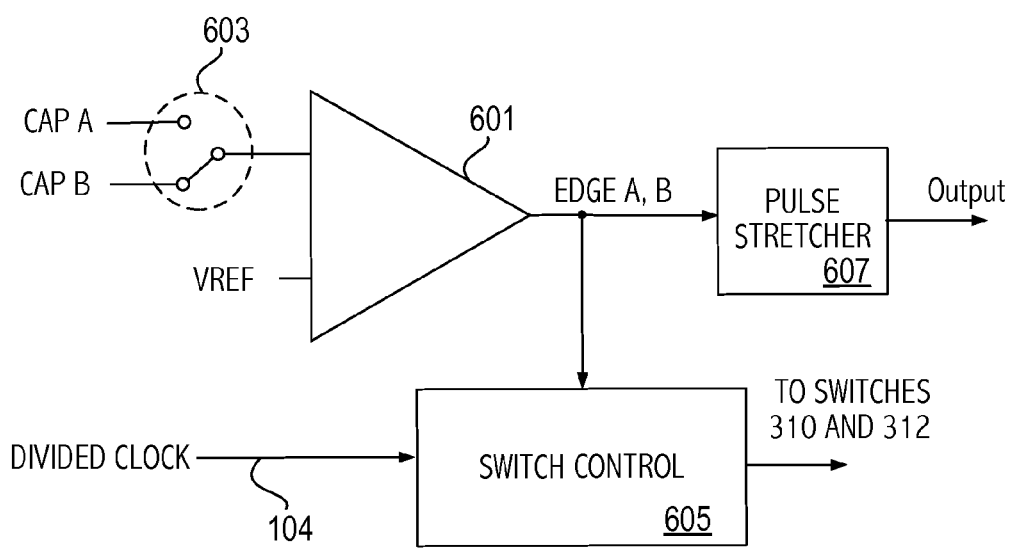
FIG. 6 illustrates additional aspects of a digital-to-time converter according to another embodiment.

Referring to FIG. 6, another embodiment uses single comparator 601 to compare the voltages on capacitor A and capacitor B to the threshold voltage (VREF). A switch 603 selects the appropriate capacitor to connect based on a control signal (not shown) from switch control logic 605. The switch 603 switches from capacitor A to capacitor B after capacitor A reaches the threshold voltage and vice versa. Switch control logic 605 also controls switches 310 and 312 (see FIG. 3) in accordance with the timing diagram of FIG. 4. Using the single comparator 601 ensures that the comparator offset is identical for both interleaved measurements, and therefore the comparator offset does not contribute to interleaving jitter. The rising edges of the comparator output are supplied to the control logic 605 to help prepare the capacitors for the next cycle. In addition, the rising edges are supplied to pulse stretcher 607, which, in an embodiment, ensures that the duty cycle of the output clock signal is within predetermined limits, .e.g., 45-55%. Other pulse generation approaches may of course be utilized. Note that in the embodiments illustrated in FIGS. 5 and 6 the control logic 505 and 605 receives the divided clock signal 104. In the particular embodiments illustrated, the divided clock has a high portion with a pulse width equal to a MEMS clock period and has a low portion varying between one and two MEMS periods. Using the divided clock allows the control logic to be run at the lower clock frequency of the divided clock compared to the MEMS clock frequency, which saves power.

The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. An integrated circuit comprising:
   a fractional-N divider circuit coupled to receive a first clock signal and supply a divided clock signal; and
   a digital-to-time converter circuit coupled to receive the divided clock signal and a digital value corresponding to a digital quantization error associated with the fractional-N divider circuit and supply an adjusted divided clock signal having a delay linearly proportional to the digital quantization error, the digital-to-time converter circuit including,
   a first capacitor and a second capacitor; and
   a first circuit and a second circuit selectively coupled to supply current to the first and second capacitors;
   wherein the digital-to-time converter circuit is configured to generate a first edge of a pulse of the adjusted divided clock signal in response to the first capacitor charging to a predetermined voltage and the digital-to-time converter circuit is configured to generate a next pulse of the adjusted divided clock signal in response to the second capacitor charging to the predetermined level.

2. The integrated circuit as recited in claim 1 further comprising:
   a MEMS oscillator coupled to supply the first clock signal.

3. The integrated circuit as recited in claim 1 further comprising a first comparator to receive a reference voltage and compare a first voltage on the first capacitor to the reference voltage, the first comparator supplying a first indication that the first capacitor has charged to the predetermined level.

4. The integrated circuit as recited in claim 3 further comprising a first switch to selectively couple the first capacitor to ground in response to the first indication.

5. The integrated circuit as recited in claim 3 further comprising a switch circuit to selectively couple a second voltage on the second capacitor to the comparator to compare the second voltage to the reference voltage level, the second comparator supplying a second indication that the second capacitor has charged to the predetermined level.

6. The integrated circuit as recited in claim 5 further comprising a second switch to selectively couple the second capacitor to ground in response to the second indication.

7. The integrated circuit as recited in claim 1 wherein during a first portion of a period of the divided clock signal the first capacitor is coupled to receive current supplied by the first circuit determined according to the quantization error and during a second portion of the period of the divided clock signal the first capacitor is coupled to receive a fixed current supplied by the second circuit.

8. The integrated circuit as recited in claim 7 wherein during a first portion of a next period of the divided clock signal, the second capacitor is coupled to receive current supplied by the first circuit based on a next quantization error and during a second portion of the next period of the divided clock signal the second capacitor is coupled to receive fixed current supplied by the second circuit.

9. The integrated circuit as recited in claim 1 wherein the first circuit and the second circuit are coupled respectively to the first and second capacitors simultaneously for a portion of a period of the divided clock signal.

10. The integrated circuit as recited in claim 1 wherein the first circuit is a first digital to analog converter coupled to receive the digital quantization error and supply a current corresponding thereto.

11. The integrated circuit as recited in claim 10 where the second circuit is a second digital to analog converter configured to provide a fixed current.

12. A method comprising:
    dividing an input clock signal in a divider circuit by integer values to generate a divided clock signal;
    charging a first capacitor with a first current based on a first quantization error associated with a first integer divide value for the divider circuit;
    charging the first capacitor with a second current having a fixed value;
    generating a first pulse of an output clock signal in response to the first capacitor charging to a predetermined level;
    charging a second capacitor with a third current based on a second quantization error associated with a second integer divide value for the divider circuit;
    charging the second capacitor with a fourth current having the fixed value; and
    generating a second pulse of the output clock signal based on the second capacitor charging to the predetermined level.

13. The method as recited in claim 12 further comprising:
    supplying the second current and the fourth current from a current source supplying a fixed current having the fixed value.

14. The method as recited in claim 12 further comprising:
    adjusting a divide ratio used by a delta sigma modulator supplying the integer values, based on temperature.

15. The method as recited in claim 12 further comprising:
    charging the first capacitor for a first portion of a period of the divided clock signal based on the first quantization error and charging the first capacitor during a second portion of the input clock cycle with the second current.

16. The method as recited in claim 15 further comprising continuing to charge the first capacitor with the second current having the fixed value until the voltage of the first capacitor equals the reference voltage.

17. The method as recited in claim 16 further comprising charging the second capacitor with the third current for a first portion of a next period of the divided clock signal based on the second quantization error and then charging the second capacitor during a second portion of the next period with the fourth current with the fixed value until the second capacitor reaches the reference voltage.

18. The method as recited in claim 17 further comprising charging the first and second capacitor at the same time during a portion of a divided clock signal period.

19. The method as recited in claim 17 further comprising:
    in response to the first capacitor reaching the reference voltage, coupling the first capacitor to a ground node to discharge the first capacitor; and
    in response to the second capacitor reaching the reference voltage, coupling the second capacitor to a ground node to discharge the second capacitor.

20. A method comprising;
    supplying a clock signal to a fractional-N divider circuit and supplying a divided clock signal from the fractional-N divider circuit;
    charging a first capacitor with a first current corresponding to a first digital quantization error during a first portion of a first period of the divided clock signal and charging a second capacitor during a first portion of a next period of the divided clock signal with a second current corresponding to a second digital quantization error;

charging the first capacitor with a third current having a fixed value during the first period of the divided clock signal and charging the second capacitor with a fourth current having the fixed value during the next period of the divided clock signal;

generating a first edge of a first pulse of an adjusted divided clock signal in response to the first capacitor charging to a predetermined voltage;

generating a first edge of a next pulse of the adjusted divided clock signal in response to the second capacitor charging to the predetermined voltage; and supplying the adjusted divided clock signal including the first and the next pulse respectively having delays linearly proportional to the first and second digital quantization errors.

* * * * *